US006757886B2

(12) United States Patent
Liebmann et al.

(10) Patent No.: US 6,757,886 B2
(45) Date of Patent: Jun. 29, 2004

(54) ALTERNATING PHASE SHIFT MASK DESIGN WITH OPTIMIZED PHASE SHAPES

(75) Inventors: Lars W. Liebmann, Poughquag, NY (US); Carlos A. Fonseca, Staten Island, NY (US); Ioana Graur, Poughkeepsie, NY (US); Mark A. Lavin, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 10/014,707

(22) Filed: Nov. 13, 2001

(65) Prior Publication Data

US 2003/0093766 A1 May 15, 2003

(51) Int. Cl.[7] ................................................ G06F 17/50
(52) U.S. Cl. .............................. 716/19; 716/20; 716/21
(58) Field of Search ............................... 716/19, 20, 21

(56) References Cited

U.S. PATENT DOCUMENTS

| | | | |
|---|---|---|---|
| 5,308,741 A | 5/1994 | Kemp | |
| 5,364,716 A | 11/1994 | Nakagawa et al. | |
| 5,403,682 A | 4/1995 | Lin | |
| 5,429,896 A | 7/1995 | Hasegawa et al. | |
| 5,432,044 A | 7/1995 | Shimizu | |
| 5,472,814 A | 12/1995 | Lin | |
| 5,526,183 A | 6/1996 | Chen | |
| 5,537,648 A | 7/1996 | Liebmann et al. | |
| 5,565,286 A | 10/1996 | Lin | |
| 5,636,131 A | 6/1997 | Liebmann et al. | |
| 5,717,218 A | 2/1998 | Coufal et al. | |
| 5,853,921 A | * 12/1998 | Moon et al. | 430/5 |
| 5,862,058 A | * 1/1999 | Samuels et al. | 716/21 |
| 5,883,813 A | 3/1999 | Kim et al. | |
| 5,895,735 A | 4/1999 | Yoon | |
| 6,057,063 A | 5/2000 | Liebmann et al. | |
| 6,251,564 B1 | 6/2001 | Lin et al. | |
| 6,416,907 B1 | * 7/2002 | Winder et al. | 430/5 |

FOREIGN PATENT DOCUMENTS

| | | |
|---|---|---|
| EP | 0 713 142 A2 | 5/1996 |
| JP | 6-95353 | 4/1994 |
| JP | 8-211590 | 5/1996 |

OTHER PUBLICATIONS

New Graph Bipartizations for Double–Exposure, Bright Field Alternating Phase–Shift Mask Layout, Andrew B. Kahng, Shailesh Vaya, and Alexander Zelikovsky, IEEE, 2001, pp. 133–138.

* cited by examiner

*Primary Examiner*—Vuthe Siek
*Assistant Examiner*—Brandon Bowers
(74) *Attorney, Agent, or Firm*—Todd M. C. Li (57) ABSTRACT

A method is described for designing an alternating phase shifted mask (altPSM) by optimally selecting the width of phase shapes. The selection of optimal phase shape widths is achieved by providing a lithography metric that describes the relationship between phase shape width and the target image dimension such that the metric, such as process window or across chip linewidth variation (ACLV), is optimized. In a preferred embodiment, ACLV is computed by Monte Carlo simulation by providing a set of error distributions for lithographic parameters such as focus, dose, lens aberrations, and the like. Alternatively, a lookup table of optimal phase widths associated with target image dimensions may be provided. The resulting altPSM is characterized by phase shapes having widths that vary according to the widths of the target image dimensions.

16 Claims, 7 Drawing Sheets

ALTERNATING PHASE SHIFT MASK DESIGN WITH OPTIMIZED PHASE SHAPES

FIELD OF THE INVENTION

The present invention relates to the manufacture of very large scale integrated (VLSI) circuit design and more specifically relates to generating phase shifted mask designs.

BACKGROUND OF THE INVENTION

A very large scale integrated (VLSI) complementary metal oxide semiconductor (CMOS) chip is manufactured on a silicon wafer by a sequence of material additions (i.e., low pressure chemical vapor depositions, sputtering operations, etc.), material removals (i.e., wet etches, reactive ion etches, etc.), and material modifications (i.e., oxidations, ion implants, etc.). These physical and chemical operations interact with the entire wafer. For example, if a wafer is placed into an acid bath, the entire surface of the wafer will be etched away. In order to build very small electrically active devices on the wafer, the impact of these operations has to be confined to small, well defined regions.

Lithography in the context of VLSI manufacturing of CMOS devices is the process of patterning openings in photosensitive polymers (sometimes referred to as photoresists or resists) which define small areas in which the silicon base material is modified by a specific operation in a sequence of processing steps. The manufacturing of CMOS chips involves the repeated patterning of photoresist, followed by an etch, implant, deposition, or other operation, and ending with the removal of the expended photoresist to make way for the new resist to be applied for another iteration of this process sequence.

The basic lithography system consists of a light source, a stencil or photo mask containing the pattern to be transferred to the wafer, a collection of lenses, and a means for aligning existing patterns on the wafer with patterns on the mask. The aligning may take place in an aligning step or steps and may be carried out with an aligning apparatus. Since a wafer containing from 50 to 100 chips is patterned in steps of 1 to 4 chips at a time, these lithography tools are commonly referred to as steppers. The resolution, R, of an optical projection system such as a lithography stepper is limited by parameters described in Raleigh's equation:

$$R = k\lambda/NA,$$

where $\lambda$ represents the wavelength of the light source used in the projection system and NA represents the numerical aperture of the projection optics used. "k" represents a factor describing how well a combined lithography system can utilize the theoretical resolution limit in practice and can range from about 0.8 down to about 0.5 for standard exposure systems. The highest resolution in optical lithography is currently achieved with deep ultra violet (DUV) steppers operating at 248 nm. Wavelengths of 356 nm are also in widespread use and 193 nm wavelength lithography is becoming commonplace.

Conventional photo masks consist of chromium patterns on a quartz plate, allowing light to pass wherever the chromium has been removed from the mask. Light of a specific wavelength is projected through the mask onto the photoresist coated wafer, exposing the resist wherever hole patterns are placed on the mask. Exposing the resist to light of the appropriate wavelength causes modifications in the molecular structure of the resist polymers which, in common applications, allow a developer to dissolve and remove the resist in the exposed areas. Such resist materials are known as positive resists. (Negative resist systems allow only unexposed resist to be developed away.) The photo masks, when illuminated, can be pictured as an array of individual, infinitely small light sources which can be either turned on (points in clear areas) or turned off (points covered by chrome). If the amplitude of the electric field vector which describes the light radiated by these individual light sources is mapped across a cross section of the mask, a step function will be plotted reflecting the two possible states that each point on the mask can be found (light on, light off).

These conventional photo masks are commonly referred to as chrome on glass (COG) binary masks, due to the binary nature of the image amplitude. The perfectly square step function of the light amplitude exists only in the theoretical limit of the exact mask plane. At any given distance away from the mask, such as in the wafer plane, diffraction effects will cause images to exhibit a finite image slope. At small dimensions, that is, when the size and spacing of the images to be printed are small relative to the $\lambda/NA$, electric field vectors of adjacent images will interact and add constructively. The resulting light intensity curve between the image features is not completely dark, but exhibits significant amounts of light intensity created by the interaction of adjacent features. The resolution of an exposure system is limited by the contrast of the projected image, that is, the intensity difference between adjacent light and dark image features. An increase in the light intensity in nominally dark regions will eventually cause adjacent features to print as one combined structure rather than discrete images.

The quality with which small images can be replicated in lithography depends largely on the available process window; that is, that amount of allowable dose and focus variation that still results in correct image size. Phase shifted mask (PSM) lithography improves the lithographic process window or allows operation at a lower k value by introducing a third parameter on the mask. The electric field vector, like any vector quantity, has a magnitude and direction, so, in addition to turning the electric field amplitude on and off, it can be turned on with a phase of about 0° or turned on with a phase of about 180°. This phase variation is achieved in PSMs by modifying the length that a light beam travels through the mask material. By recessing the mask to an appropriate depth, light traversing the thinner portion of the mask and light traversing the thicker portion of the masks will be 180° out of phase, that is, their electric field vector will be of equal magnitude but point in exactly the opposite direction so that any interaction between these light beams result in perfect cancellation. However, because the 180° phase transition forces a minimum in the image intensity, narrow dark lines will be printed. These unwanted residual phase images are erased using a trim mask, which is a second mask that transmits light only in regions left unexposed by the residual phase edge.

Alternating Phase Shifted Mask (altPSM) lithography is a resolution enhancement technique that is rapidly gaining acceptance as a viable solution to meet aggressive integrated circuit (IC) technology scaling time-lines. Delays in next generation optical and non-optical lithography tooling add vital importance to successful implementation of altPSM. AltPSM takes advantage of destructive interference of light to double the achievable resolution of an optical lithography system. The light interference is created by selectively manipulating the topography of the photomask to introduce an appropriate path-length difference in the imaging light. This manipulation of the mask topography requires phase information to be added to the circuit layout in the computer-aided design (CAD) system. Key to the successful implementation of altPSM is an efficient electronic design automation (EDA) tool that can convert circuit designs to altPSM layouts with minimal impact to layout design density or design complexity. The process of defining portions of the mask as 0° phase regions and other portions as 180° phase regions is generally referred to as phase coloring. Techniques for automatic phase coloring are known. For example, Kim et al. (U.S. Pat. No. 5,883,813) describes a method for automatically assigning binary phase coloring in altPSM designs by the use of net coloring. In the method of Kim et al., nets are defined as coupled intrusion pairs of phase shapes, where the phase of one shape determines the phase of the other shape within each intrusion pair. The intrusion pairs are shapes that are close enough that light passing through the shapes will interact and affect the image intensity between the shapes. Thus, intrusion pairs that are sufficiently close together will likewise interact and will be coupled together by a "connected" function that defines a net. All phase shapes within a net will be colored together such that phases alternate across each critical element. The technique of Kim et al. can be applied to both dark-field and light-field PSM designs, and can be adapted to both flat and hierarchical VLSI CAD databases.

Figure 1:
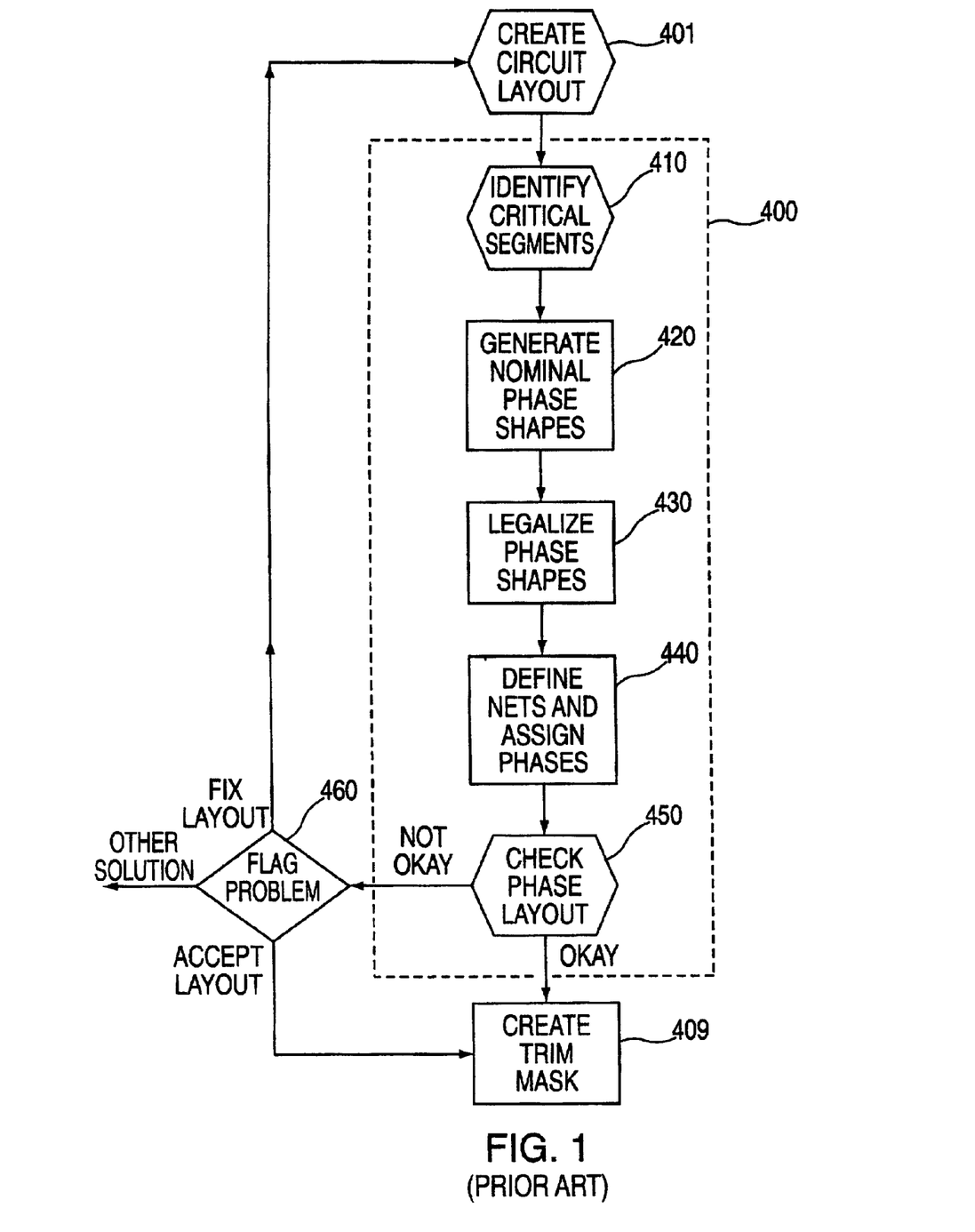
FIG. 1 illustrates a prior art flow chart for a method or computer program product for optimizing an altPSM layout.

Methods to assign and optimize phases in an altPSM design are known in the art, for example, as described in U.S. Pat. Nos. 5,537,648 and 5,636,131 (Liebmann et al.) and U.S. Pat. No. 6,057,063 (Liebmann et al.). FIG. 1 illustrates a flow chart typical of such methods. After creating an initial circuit layout (Block 401), the design of the altPSM (Block 400) is performed. Critical circuit elements having critical dimension CD are identified, as indicated in Block 410 of FIG. 1. Phase shapes are defined in association with each critical element (Block 420). Then the phase shapes are legalized according to the various rules as discussed above (Block 430). Next, the appropriate phases are assigned to each phase shape (Block 440), ensuring binary coloring across the entire mask layout. A method for performing binary coloring is described, for example, in Kim et al. (U.S. Pat. No. 5,883,813). The phase coloring method of Kim et al. involves the formation of nets of phase shapes by creating a "connected" function that links or couples phase shapes across critical elements as intrusion pairs, meaning that the phase of one shape determines the phase of the other shape in the intrusion pair. The "connected" function also includes shapes that are close enough the be phase coupled. "Close enough" could mean that there must be a minimum phase-to-phase spacing, which will be discussed further below. After the phase have been assigned in conformance with the various rules, the layout is checked for any inconsistencies or errors (Block 450). If layout conforms with all rules, then the altPSM design is accepted and the associated trim mask is then designed (Block 409). Since it may not be possible to correct all such errors, it may be necessary to accept a loss in process window, or re-design the circuit layout (Block 460).

Figure 2:
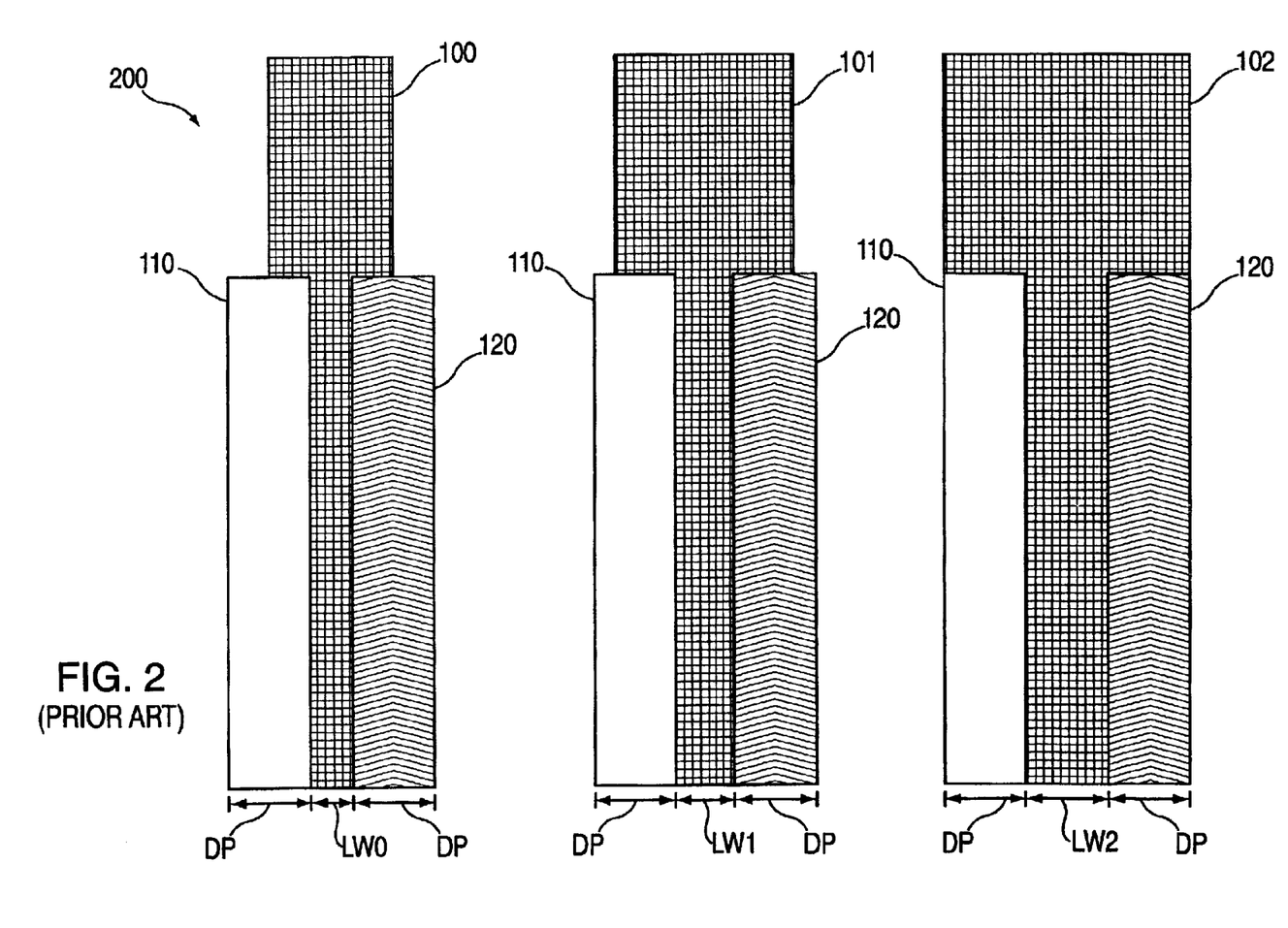
FIG. 2 illustrates an example of an plan view of a prior art altPSM layout.

The generation of an altPSM layout requires the addition of phase shapes disposed on opposing sides of layout dimensions representing target image dimensions that approach the resolution limits of the lithography system. In current altPSM design methodologies, the generation of phase shifting shapes (Block 420 of FIG. 1) is based on a cutoff dimension for layout shape widths below which phase shifting is required. If the layout width is larger than the cutoff dimension, no phase shifting is required, and the phase shapes are not drawn by the layout tool. If the layout dimension is less than the cutoff dimension, standard methods result in generating phase shapes having a predetermined, fixed width. For example, FIG. 2 illustrates a schematic of a transistor altPSM layout 200 generated according to standard methods. The first transistor feature 100 includes a line having a layout dimension LW0 less than the cutoff dimension (sub-cutoff layout dimension), which is defined on the altPSM layout with 0° phase region 110 and 180° phase region 120. Similarly, a second transistor 101 is shown having a sub-cutoff layout dimension LW1 and a third transistor 102 having a sub-cutoff layout dimension LW2. The sub-cutoff layout dimensions LW0, LW1 and LW2 are each different in layout 200, and each of the phase shapes 110 and 120 have the same width DP.

Figure 3A:
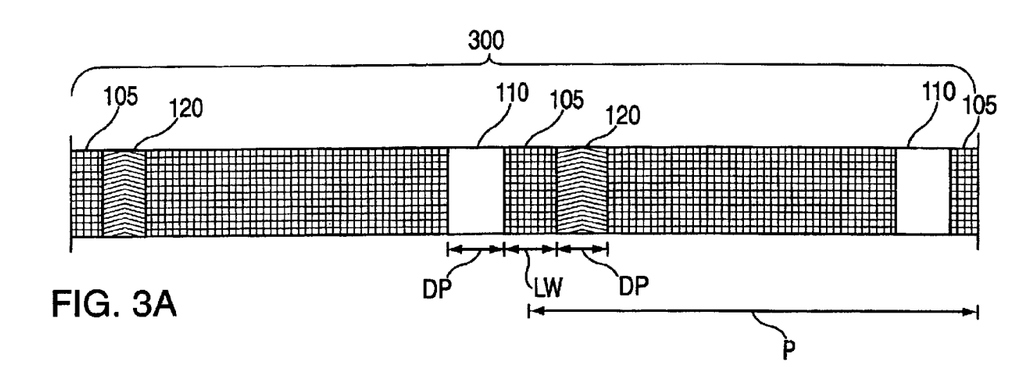
FIGS. 3A–3C illustrates a simulation of process window for target image dimension as a function of phase width.
Figure 3B:
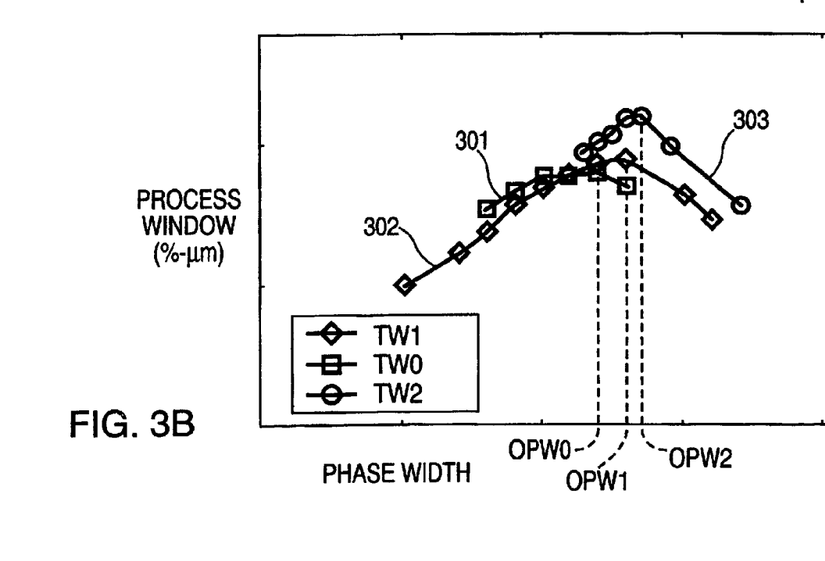
Figure 3C:
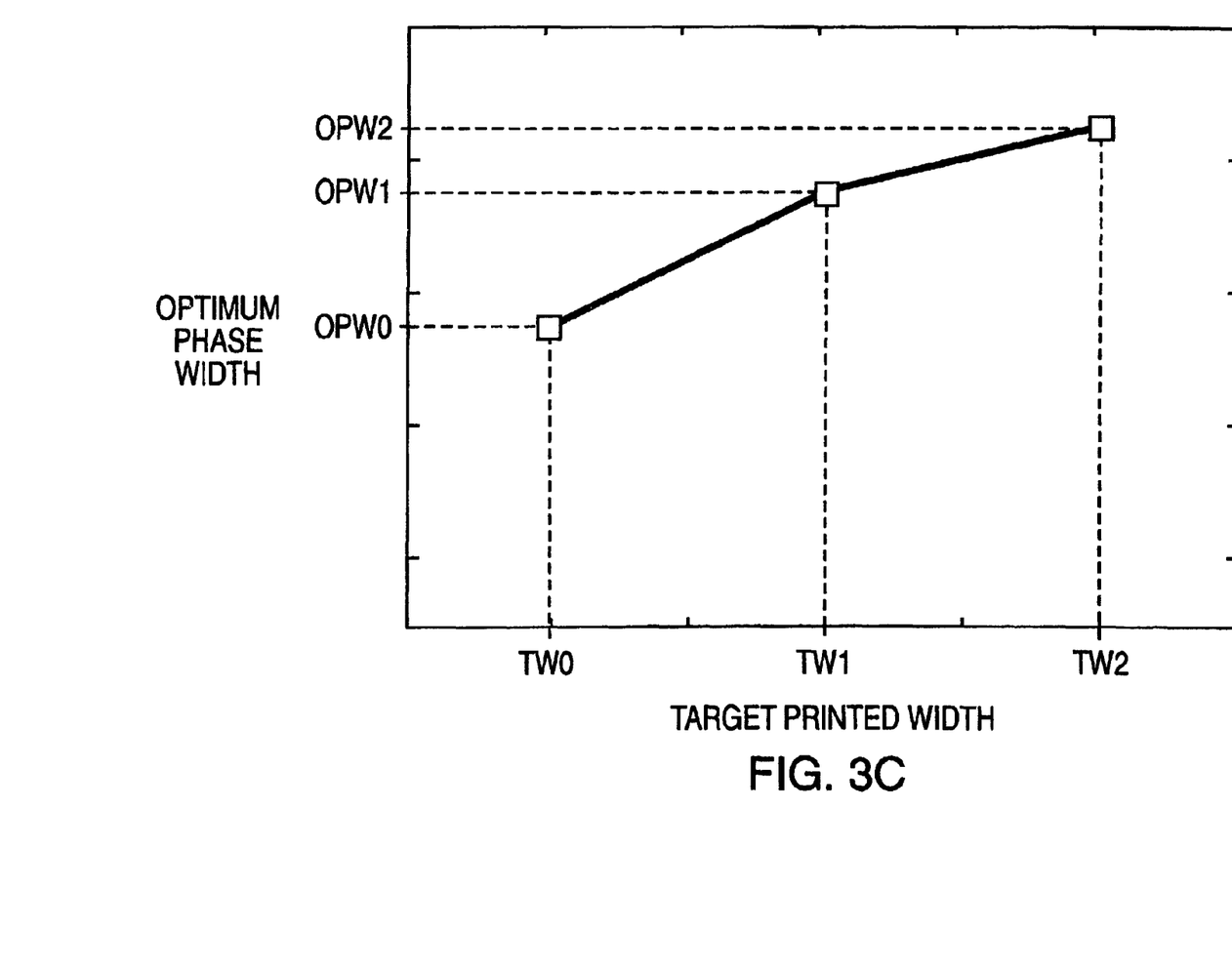

However, the width of the phase shapes has an impact on process window and across-chip line width variation (ACLV). For example, referring to FIG. 3A, a portion of an altPSM layout 300 is illustrated. In layout 300, critical elements 105 are defined having a sub-cutoff layout dimension (LW), and spaced apart by pitch P. On opposing sides of the LW are a 0° phase region 110 and a 180° phase region 120 each having phase width of DP. FIG. 3B illustrates the results of a simulation of process window, which is a function of focus and dose, assuming 0.75 NA (numerical aperture), illumination wavelength of 193 nm (using an ArF laser source), 0.35 Sigma (partial coherence of the tool), and a pitch (P) of 1300 nm. The process window curves are plotted for target image widths of TW0 (301), TW1 (302), and TW2 (303). It can be seen that for each target width, the optimal process window is obtained by using a different phase width. The optimal phase widths for each of these target CDs are plotted in FIG. 3C. It can be seen that for a given target CD, the optimal phase shape width varies, thus current methods of assigning altPSM phase shapes, which specify fixed phase shape widths, do not necessarily result in an optimal process window. Similarly, image quality will also be impacted. One metric of image quality is the across-chip line width variation (ACLV), which is perhaps even more important to minimize since ACLV is a measure of overall chip quality. The optimal phase shapes that minimize ACLV will likewise vary with target image dimension.

In view of the foregoing discussion, there is a need to provide for a method for designing an alternating phase shifted mask (altPSM) having phase shape dimensions that optimize process window and image quality.

SUMMARY OF THE INVENTION

The present invention addresses the above-described need by providing a method for optimizing the design of an alternating phase shifted mask (altPSM) by selecting phase shapes that have widths optimized according to the width of the target critical element.

It is the further object of the present invention to provide a method for optimizing the design of an alternating phase shifted mask (altPSM) so that the across-chip line width variation is minimized or process window is maximized.

This invention has the further objective of providing an automated method of optimizing the design of an altPSM that maximizes process window and minimizes across-chip line width variation which can be incorporated into existing software methodologies.

According to one aspect of the present invention, a method is described for designing an alternating phase shifting mask (altPSM) for projecting an image on an image plane, the method comprising:

providing a circuit layout;

identifying a critical element of said circuit layout, said critical element having a layout dimension (LW), said layout dimension corresponding to a target image dimension in the image plane;

providing a relationship between phase shape width and said target image dimension;

selecting an optimal phase shape width so that said relationship has an optimal value; and generating a phase shape disposed adjacent to said layout dimension wherein said phase shape has said optimal phase shape width.

According to another aspect of the present invention, the step of providing a relationship between phase shape width and target dimension is performed by computing across-chip line width variation (ACLV) for each target image dimension as a function of phase width. The computation of ACLV is preferably performed by providing a distribution of errors for a set of lithographic parameters, which may include focus, dose, lens aberration, mask critical dimension error, transmission error, phase error, mask manufacturability error, or a combination thereof. The distribution of errors is preferably obtained empirically. Alternatively, a theoretical distribution of errors may be used. For example, experience has shown that a gaussian distribution is often representative of actual lithographic processing. A Monte Carlo simulation of a target image dimension, such as line width, performed for a set of about 10,000 realizations is typically adequate, and the standard deviation of ACLV can be computed with respect to the target image dimension for these simulations. The selection of phase widths are then preferably chosen so that ACLV is minimized within a tolerance, for example, 3 standard deviations from the target width.

According to another aspect of the present invention, the step of providing a relationship between phase shape width and target image dimension is performed by computing process window for each target image dimension as a function of phase width.

According to another aspect of the present invention, the relationship between target image dimension and phase width may be provided in a lookup table. In some designs, the relationship may be expressed as a ratio between target image dimension and phase width, for example, phase width equal to about 0.8–1.2×layout dimension (LW).

According to yet another aspect of the present invention, an alternating phase shifted mask is formed that is characterized by phase shapes with widths that vary according to the widths of the target image dimensions.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF THE PREFERRED EMBODIMENTS

In the following descriptions of the preferred embodiments of the invention, a method for optimizing the design of an altPSM layout. It will be appreciated that this is intended as an example only, and that the invention may be practiced under a variety of conditions and using a variety of layouts and design constraints.

As discussed above, FIG. 1 illustrates a prior art flow chart for a method of optimizing altPSM layouts (Block 400). The generation of phase shapes (Block 420) is performed in prior art methods when layout element dimensions are less than a cutoff dimension, as discussed above. Such prior art phase shapes have a predetermined fixed dimension.

Figure 4:
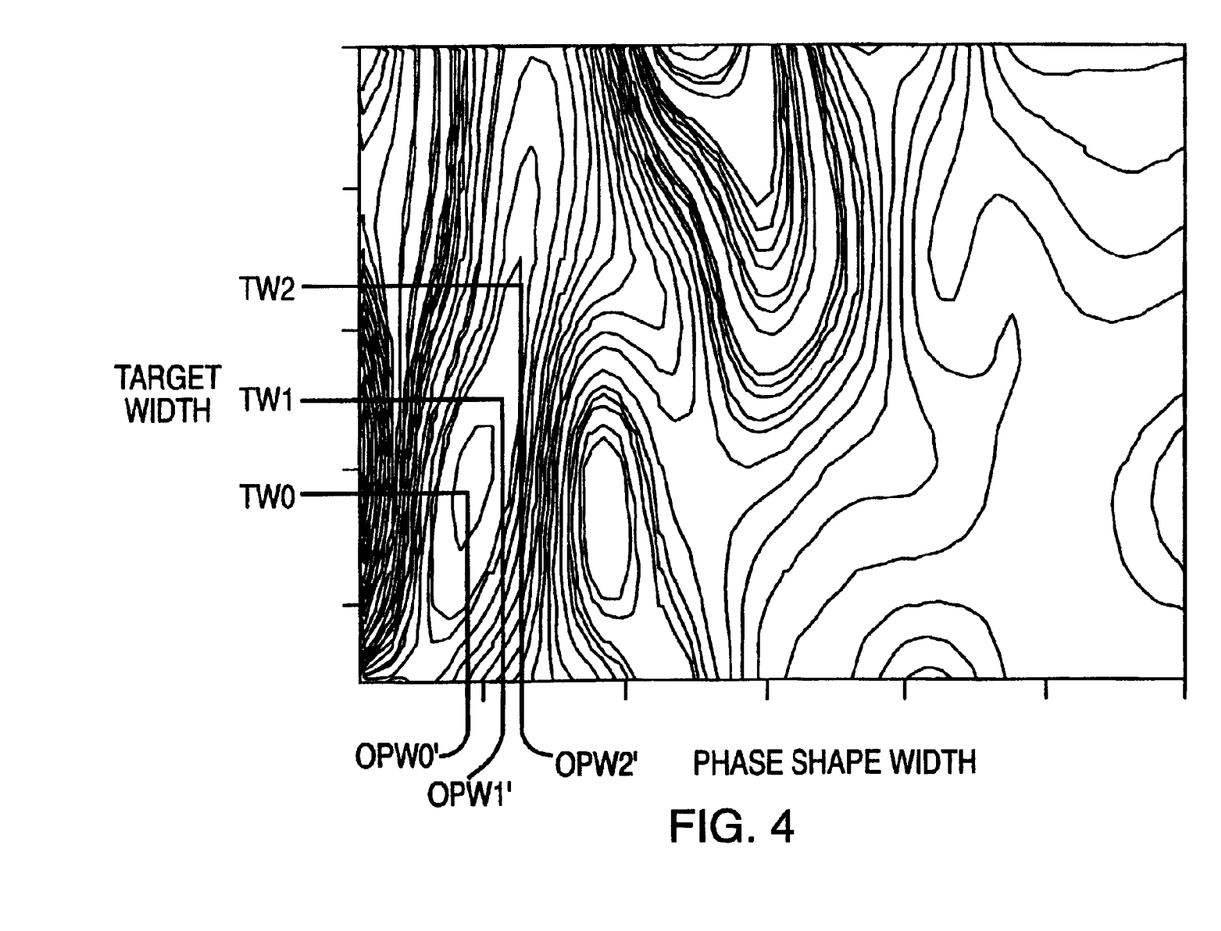
FIG. 4 illustrates a contour plot of across chip linewidth variation for target image dimension as a function of phase width.

The method for generating phase shapes in accordance with the present invention generates phase shapes that are an optimized function of the target image dimension corresponding to the layout dimension being phase shifted. One method of generating phase shapes in accordance with the present invention is to compute the process window (as a function of focus and dose) for a family of target image dimensions and phase widths, as described in FIGS. 3A through 3C above, and then selecting the phase shape widths that maximize the process window. Other metrics of process window or image quality may also be used. For example, another embodiment of the method can be performed by first computing the across-chip line width variation (ACLV) for a matrix of target image widths and phase shape widths. In a preferred embodiment, a distribution of lithographic process errors is measured empirically. Alternatively, a theoretical distribution of errors may be assumed. For example, a gaussian distribution of focus errors can be provided, which is consistent with past experience or based on actual measurements for a tool or set of tools. Error distributions may also be generated for other lithographic parameters such as dose, lens aberration, mask critical dimension errors, transmission errors, phase errors, and mask manufacturability errors, to name a few. For a given target image width and for a range of phase shape widths, a Monte Carlo simulation is performed to generate a number of statistical realizations of the lithographic processing errors for each pair of target image widths and phase shape widths. The number of realizations required to yield statistically valid results varies, but 10,000 realizations are typically adequate. For each set of 10,000 realizations, the across-chip line width variation is computed, and ACLV can be plotted, for example, at 3 standard deviations from the target image width. FIG. 4 illustrates a contour plot of ACLV as a function of target image width and phase widths. From the results of this computation, an optimal phase shape width OPW0', OPW1' and OPW2', can be selected for each target image width TW0, TW1 and TW2, respectively, that will minimize the ACLV, and in turn will improve yield and reliability of the resulting product. Although the relationship between target image width and optimal phase width is generally not linear, it is may be possible in some cases to obtain nearly optimal process window or ACLV by selecting phase widths that are about 0.8–1.2×layout width (LW). Alternatively, a lookup table, using either a Monte Carlo simulation of ACLV or other simulation of process window, of preferred phase shape widths as a function of target image widths. In some mask design situations, the optimal values may require a computation on a case by case basis.

Figure 5:
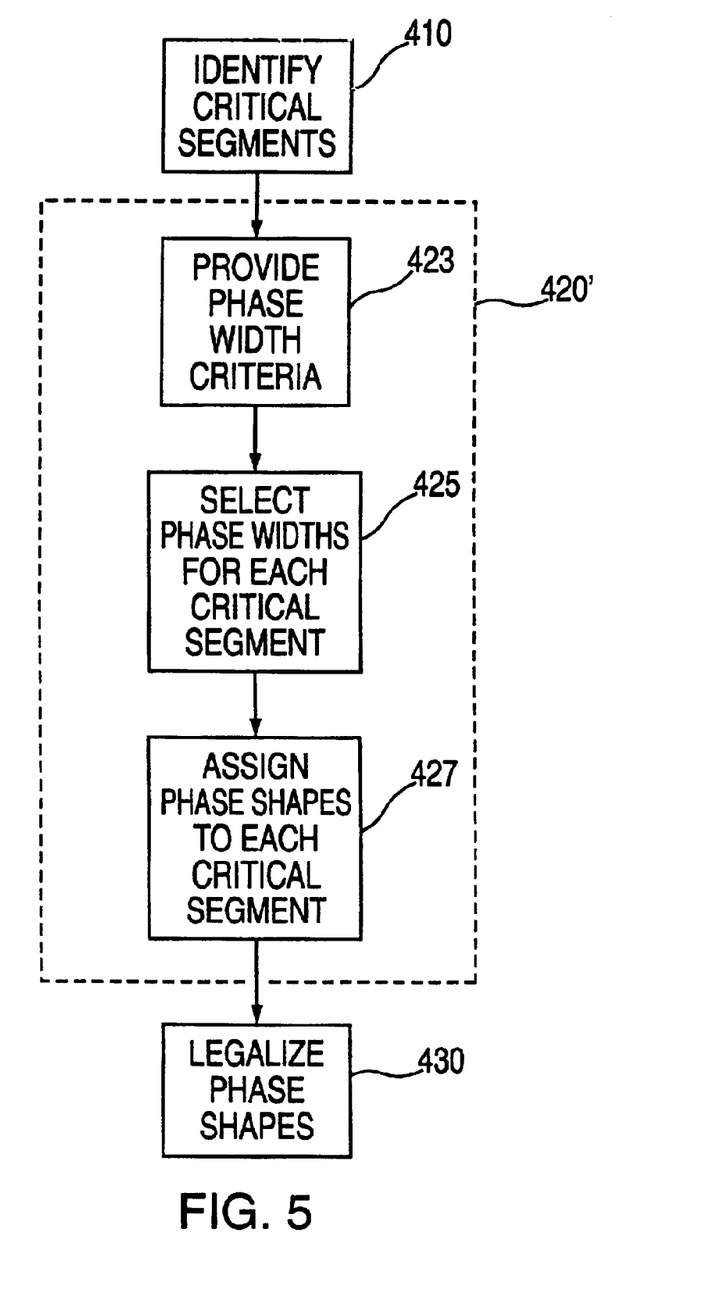
FIG. 5 illustrates a flow chart of a method or computer program product implemented in accordance with the present invention.
Figure 6:
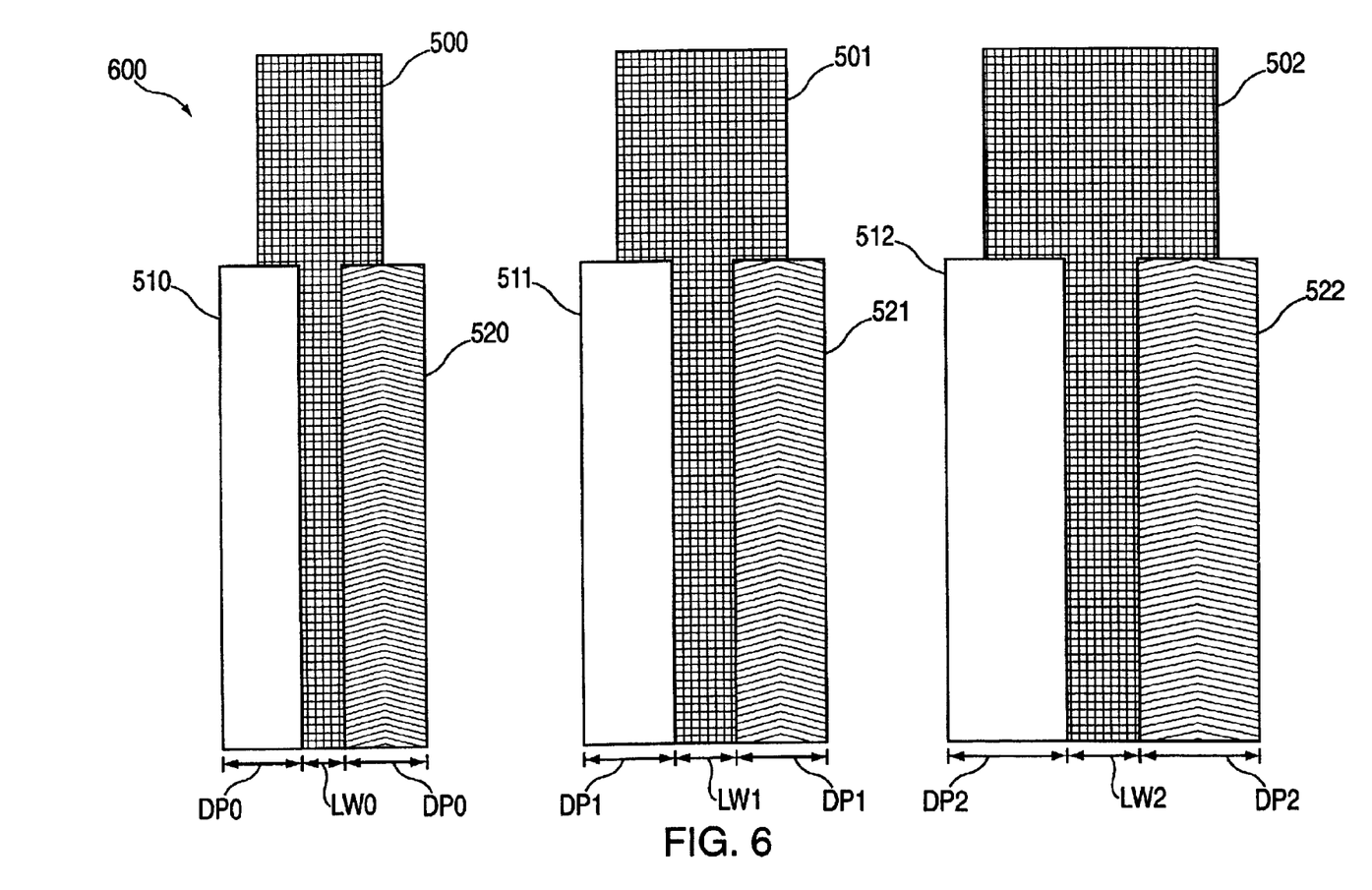
FIG. 6 illustrates an plan view of a layout of an altPSM designed in accordance with the present invention.

Therefore, in accordance with the present invention, the step of generating nominal phase shapes is modified as illustrated in Block 420' of FIG. 5. First, for all of the target image widths present in the provided circuit layout, phase shape width selection criteria are provided, preferably by computing the ACLV for a range of phase shape widths (Block 423). The optimal phase shape width is preferably chosen so that ACLV is minimized within a range of standard deviations of the target image width, for example, within 3 standard deviations. Alternatively, in some situations, experience may show that optimal phase widths that minimize ACLV typically fall in the range of 0.8–1.2 times the layout width (LW). Thus, another embodiment of the present invention simply provides phase widths that are selected to be about 0.8–1.2×LW. In another embodiment, the preferred phase width is selected from a provided lookup table computed prior to entering Block 423, rather than performing a computation on the fly. Then, in Block 425, for each layout dimension smaller than the cutoff dimension (in other words, a sub-cutoff layout dimension), the phase width is chosen that yields an optimal lithography metric, such as minimum ACLV or maximum process window. Note that the cutoff dimension is not limited to a single value, but could include multiple values, or could be derived from a functional relationship, for example, between layout dimension and target image dimension. Finally, a set of optimal phase shape pairs are assigned and disposed on opposite sides of the sub-cutoff layout dimension of each critical element (Block 427). For example, referring to FIG. 6, the layout 600 includes three circuit elements 500, 501 and 502 each having sub-cutoff dimensions LW0, LW1 and LW2, respectively. Using ACLV as a lithography metric, in accordance with the present invention, optimal phase shapes are chosen and disposed on opposing sides of the respective sub-cutoff layout dimensions associated with each target image dimension so that ACLV is minimized. Thus, the widths DP0 of phase shapes 510 and 520 associated with circuit element 500 are both selected to be OPW0' which minimizes ACLV for target image width TW0 in accordance with a computation such as that illustrated in FIG. 4. Similarly, the widths DP1 of phase shapes 511 and 521 are chosen to be OPW1' to minimize ACLV for target width TW1 and the widths DP2 of phase shapes 512 and 522 are chosen to minimize ACLV for target image width TW2 (see FIG. 4). Alternatively, the phase width could be chosen based on a maximization of process window, or a combined optimization of process window and ACLV, or other appropriate metrics of image quality. Once the initial phase shapes are assigned, a legalization of the phase shapes across the layout is performed as usual (Block 430).

The resulting alternating phase shifted mask that is formed in accordance with the present invention is characterized by phase shapes having widths that vary according to the widths of the target image dimensions. In some cases, the phase shape widths may be characterized by a linear relationship with the layout dimension that is associated with the target image dimension. For example, in some cases, setting phase widths equal to about 0.8–1.2 times the critical layout dimension may be sufficient to obtain a mask having nearly optimal process window characteristics. In the general case, the mask formed may have phase widths that vary according to a metric of target image quality such as ACLV or process window, as discussed above.

It will be appreciated by those skilled in the art that the method and software in accordance with the present invention is not limited to dark field altPSM design, but could also apply and be adapted to light field altPSM design. Accordingly, the invention is intended to encompass all such alternatives, modifications and variations which fall within the scope and spirit of the invention and the following claims.

We claim:

1. A method for designing an alternating phase shifting mask (altPSM) for projecting an image on an image plane, the method comprising:

providing a circuit layout;

identifying a critical element of said circuit layout, said critical element having a layout dimension (LW), said layout dimension corresponding to a target image dimension in the image plane;

providing a relationship between phase shape width and said target image dimension;

selecting an optimal phase shape width so that said relationship has an optimal value; and generating a phase shape disposed adjacent to said layout dimension wherein said phase shape has said optimal phase shape width.

2. The method of claim 1 wherein said relationship comprises process window, and said selecting further comprises maximizing said process window.

3. The method of claim 1 wherein said providing a relationship comprises providing a lookup table having optimal phase shape widths for a range of target image dimensions stored therein.

4. The method of claim 1 wherein said relationship comprises a requirement that said optimal phase shape width be in the range 0.8–1.2×LW.

5. A method for designing an alternating phase shifting mask (altPSM) for projecting an image on an image plane, the method comprising:

providing a circuit layout;

identifying a critical element of said circuit layout, said critical element having a layout dimension (LW), said layout dimension corresponding to a target image dimension in the image plane;

providing a relationship between phase shape width and said target image dimension;

selecting an optimal phase shape width so that said relationship has an optimal value; and generating a phase shape disposed adjacent to said layout dimension wherein said phase shape has said optimal chase shape width, wherein said relationship comprises across-chip line width variation (ACLV), and said selecting further comprises minimizing said ACLV.

6. The method of claim 5 wherein said providing a relationship further comprises providing at least one distribution of process errors in at least one lithographic parameter and computing a set of ACLV realizations for said target image dimension and computing the standard deviation of said ACLV realizations for said target image dimension.

7. The method of claim 6 wherein said at least one lithographic parameter is selected from the group consisting of dose, focus, lens aberration, mask critical dimension error, transmission error, phase error, mask manufacturability error, and a combination thereof.

8. The method of claim 7 wherein said at least one distribution comprises a gaussian distribution.

9. A computer program product comprising a computer readable storage medium having stored therein instructions executable by the computer for performing a method for designing an alternating phase shifting mask (altPSM) for projecting an image on an image plane, the method comprising:

provinding a circuit layout;

identifying a critical element of said circuit layout, said critical element having a layout dimension (LW), said layout dimension corresponding to a target image dimension in the image plane;

providing a relationship between phase shape width and said target image dimension;

selecting an optimal phase shape width so that said relationship has an optimal value; and generating a phase shape disposed adjacent to said layout dimension wherein said phase shape has said optimal phase shape width.

10. The computer program product of claim 9 wherein said relationship comprises process window, and said selecting further comprises maximizing said process window.

11. The computer program product of claim 9 wherein said providing a relationship comprises providing a lookup table having optimal phase shape widths for a range of target image dimensions stored therein.

12. The computer program product of claim 9 wherein said relationship comprises a requirement that said optimal phase shape width be in the range 0.8–1.2×LW.

13. A computer program product comprising a computer readable storage medium having stored therein instructions executable by the computer for performing a method for designing an alternating phase shifting mask (altPSM) for projecting an image on an image plane, the method comprising:

providing a circuit layout;

identifying a critical element of said circuit layout, said critical element having a layout dimension (LW), said layout dimension corresponding to a target image dimension in the image plane;

providing a relationship between phase shape width and said target image dimension;

selecting an optimal phase shape width so that said relationship has an optimal value; and generating a phase shape disposed adjacent to said layout dimension wherein said phase shape has said optimal phase shape width.

wherein said relationship comprises across-chip line width varation (ACLV), and said selecting further comprises minimizing said ACLV.

14. The computer program product of claim 13 wherein said providing a relationship further comprises providing at least one distribution of process errors in at least one lithographic parameter and computing a set of ACLV realizations for said target image dimension and computing the standard deviation of said ACLV realizations for said target image dimension.

15. The computer program product of claim 14 wherein said at least one lithographic parameter is selected from the group consisting of dose, focus, lens aberration, mask critical dimension error, transmission error, phase error, mask manufacturability error, and a combination thereof.

16. The computer program product of claim 15 wherein said at least one distribution comprises a gaussian distribution.

* * * * *